(12) United States Patent
Tsai et al.

(10) Patent No.: US 11,545,598 B2
(45) Date of Patent: Jan. 3, 2023

(54) WAVELENGTH CONVERSION ELEMENT AND PROJECTION APPARATUS

(71) Applicant: Coretronic Corporation, Hsin-Chu (TW)

(72) Inventors: Chia-Lun Tsai, Hsin-Chu (TW); Chi-Tang Hsieh, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 17/227,395

(22) Filed: Apr. 12, 2021

(65) Prior Publication Data

US 2021/0376198 A1    Dec. 2, 2021

(30) Foreign Application Priority Data

May 27, 2020    (CN) .......................... 202010459969.0

(51) Int. Cl.
*H01L 33/50*    (2010.01)
*G02B 26/00*    (2006.01)
*G03B 21/20*    (2006.01)

(52) U.S. Cl.
CPC .......... *H01L 33/502* (2013.01); *G02B 26/008* (2013.01); *G03B 21/204* (2013.01); *H01L 33/505* (2013.01)

(58) Field of Classification Search
None
See application file for complete search history.

(56) References Cited

U.S. PATENT DOCUMENTS

| 2019/0068936 A1* | 2/2019 | Takagi ................. G02B 27/141 |
| 2019/0243224 A1 | 8/2019 | Yamada et al. |
| 2019/0302591 A1* | 10/2019 | Nojima ............. G03B 21/2066 |
| 2019/0361221 A1 | 11/2019 | Hsieh et al. |

FOREIGN PATENT DOCUMENTS

| CN | 105301878 A | 2/2016 |
| CN | 105737103 A | 7/2016 |
| CN | 107728412 A * | 2/2018 .......... G03B 21/204 |
| CN | 208297917 U | 12/2018 |
| CN | 110687674 A | 1/2020 |

(Continued)

*Primary Examiner* — Bao-Luan Q Le
*Assistant Examiner* — Danell L Owens

(57) ABSTRACT

A wavelength conversion element includes a substrate, an adhesion layer and a wavelength conversion material. The substrate has a bearing surface having an adhesion zone. The adhesion zone has a central portion and two edge portions respectively on two sides of the central portion. The adhesion layer is disposed on the adhesion zone and includes a first adhesive and a second adhesive. The first adhesive is disposed at the edge portions. The second adhesive is disposed at the central portion. Operating temperature of the first adhesive is lower than operating temperature of the second adhesive. Viscosity of the first adhesive is larger than viscosity of the second adhesive. The wavelength conversion material is fixed on the bearing surface by the first adhesive and the second adhesive. A projection apparatus having the wavelength conversion element is provided, and the durability of the wavelength conversion element and the projection apparatus is improved.

11 Claims, 9 Drawing Sheets

(56) References Cited

FOREIGN PATENT DOCUMENTS

| | | |
|---|---|---|
| CN | 110737086 A | 1/2020 |
| CN | 111149432 A | 5/2020 |
| TW | 201708878 A | 3/2017 |
| TW | 201925418 A | 7/2019 |
| WO | 2019056209 A1 | 3/2019 |

* cited by examiner

WAVELENGTH CONVERSION ELEMENT AND PROJECTION APPARATUS

CROSS-REFERENCE TO RELATED APPLICATION

This application claims the priority benefit of CN202010459969.0, filed on 2020 May 27. The entirety of the above-mentioned patent application is hereby incorporated by reference herein and made a part of this specification.

FIELD OF THE INVENTION

The invention relates to a wavelength conversion element, and more particularly relates to a wavelength conversion element adapted to a projection apparatus and a projection apparatus having the wavelength conversion element.

BACKGROUND OF THE INVENTION

Most projection apparatuses on the current market use an illumination system to generate the color light required to form a projection image. Generally, the illumination system of the projection apparatus includes a light source and a wavelength conversion element. The light source is developed from the ultra-high-performance lamp (UHP lamp), the light emitting diode (LED) into the laser diode (LD) with the requirement of the market on the brightness, color saturation, service life, non-toxic and environmentally friendly of the projection apparatuses.

Since the cost of the current high-brightness red laser diode and the present high-brightness green laser diode is too high, the blue laser diode is usually used as the excitation light source to reduce the cost. The excitation light source provides an excitation light beam to a phosphor wheel, and the phosphor wheel can convert the excitation beam into other color light (e.g., yellow light, green light, etc.) required to form the projection image.

The phosphor wheel includes a rotatable disk and a phosphor layer. In the prior art, the phosphor layer is adhered on the rotatable disk by organic silica gel. However, the energy of the excitation beam may be accumulated in the phosphor layer and transmitted to the organic silica gel and the rotatable disk, so the temperature of the phosphor layer, the organic silica gel and rotatable disk may increase continuously. Generally, the operating temperature of the rotatable disk (about 500° C. or higher) is higher than the operating temperature of the organic silica gel (about 200° C. or lower). Therefore, the organic silica gel is more likely to be burned due to the high temperature, which makes the adhesion of the phosphor layer insufficient, resulting in a decrease in the durability of the phosphor wheel.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

The invention provides a wavelength conversion element to improve the durability.

The invention provides a projection apparatus to have the advantage of improved durability.

Other objectives and advantages of the invention can be further understood from the technical features disclosed in the invention.

In order to achieve one or a portion of or all of the objectives or other objectives, an embodiment of the invention provides a wavelength conversion element including a substrate, an adhesion layer and a wavelength conversion material. The substrate has a bearing surface. The bearing surface has an adhesion zone, wherein the adhesion zone has a central portion and two edge portions respectively located on two sides of the central portion. The adhesion layer is disposed on the adhesion zone, wherein the adhesion layer includes a first adhesive and a second adhesive. The first adhesive is disposed at the two edge portions. The second adhesive is disposed at the central portion. Operating temperature of the first adhesive is lower than operating temperature of the second adhesive, and viscosity of the first adhesive is larger than viscosity of the second adhesive. The wavelength conversion material is fixed on the bearing surface by the first adhesive and the second adhesive.

In order to achieve one or a portion of or all of the objectives or other objectives, an embodiment of the invention provides a projection apparatus including an illumination system, a light valve and a projection lens. The illumination system is adapted to provide the illumination beam. The light valve is disposed on a transmission path of the illumination beam to convert the illumination beam into an image beam. The projection lens is disposed on a transmission path of the image beam. The illumination system includes an excitation light source and aforementioned wavelength conversion element. The excitation light source is adapted to provide an excitation beam. The wavelength conversion element includes a substrate, an adhesion layer and a wavelength conversion material. The substrate has a bearing surface. The bearing surface has an adhesion zone, wherein the adhesion zone has a central portion and two edge portions respectively located on two sides of the central portion. The adhesion layer is disposed on the adhesion zone, wherein the adhesion layer includes a first adhesive and a second adhesive. The first adhesive is disposed at the edge portions, and the second adhesive is disposed at the central portion. Operating temperature of the first adhesive is lower than operating temperature of the second adhesive, and viscosity of the first adhesive is larger than viscosity of the second adhesive. The wavelength conversion material is fixed on the bearing surface by the first adhesive and the second adhesive.

In the wavelength conversion element of the invention, the adhesion zone where the adhesion layer disposed on is divided into the central portion and the edge portions. Since the central portion receives more heat, the central portion is provided with the second adhesive having higher operating temperature to prevent the second adhesive from burning due to high temperature. On the other hand, since the edge portions receive less heat, the edge portions are provided with the first adhesive having larger viscosity to enhance the adhesion effect of the adhesion layer. For these reasons, the adhesion layer of the wavelength conversion element of the invention has the advantages of improved operating temperature and the viscosity, so that the durability of the wavelength conversion element is improved. Also, since the projection apparatus of the invention adopting aforementioned wavelength conversion element, the projection apparatus has the advantage of improved durability.

Other objectives, features and advantages of The invention will be further understood from the further technological features disclosed by the embodiments of The invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing", "faces", and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1:
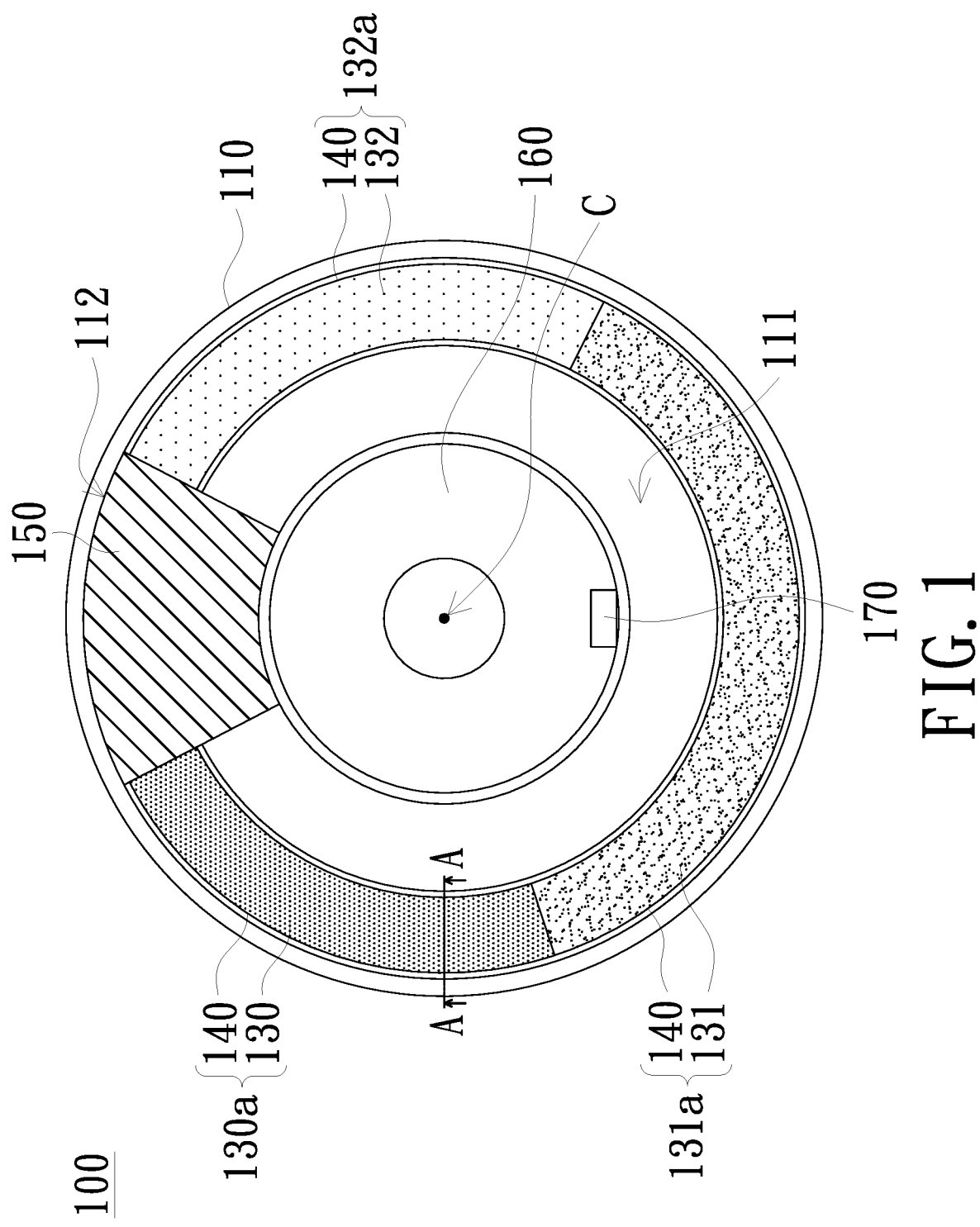
FIG. 1 is a schematic diagram of a wavelength conversion element in an embodiment of the invention.
Figure 2:
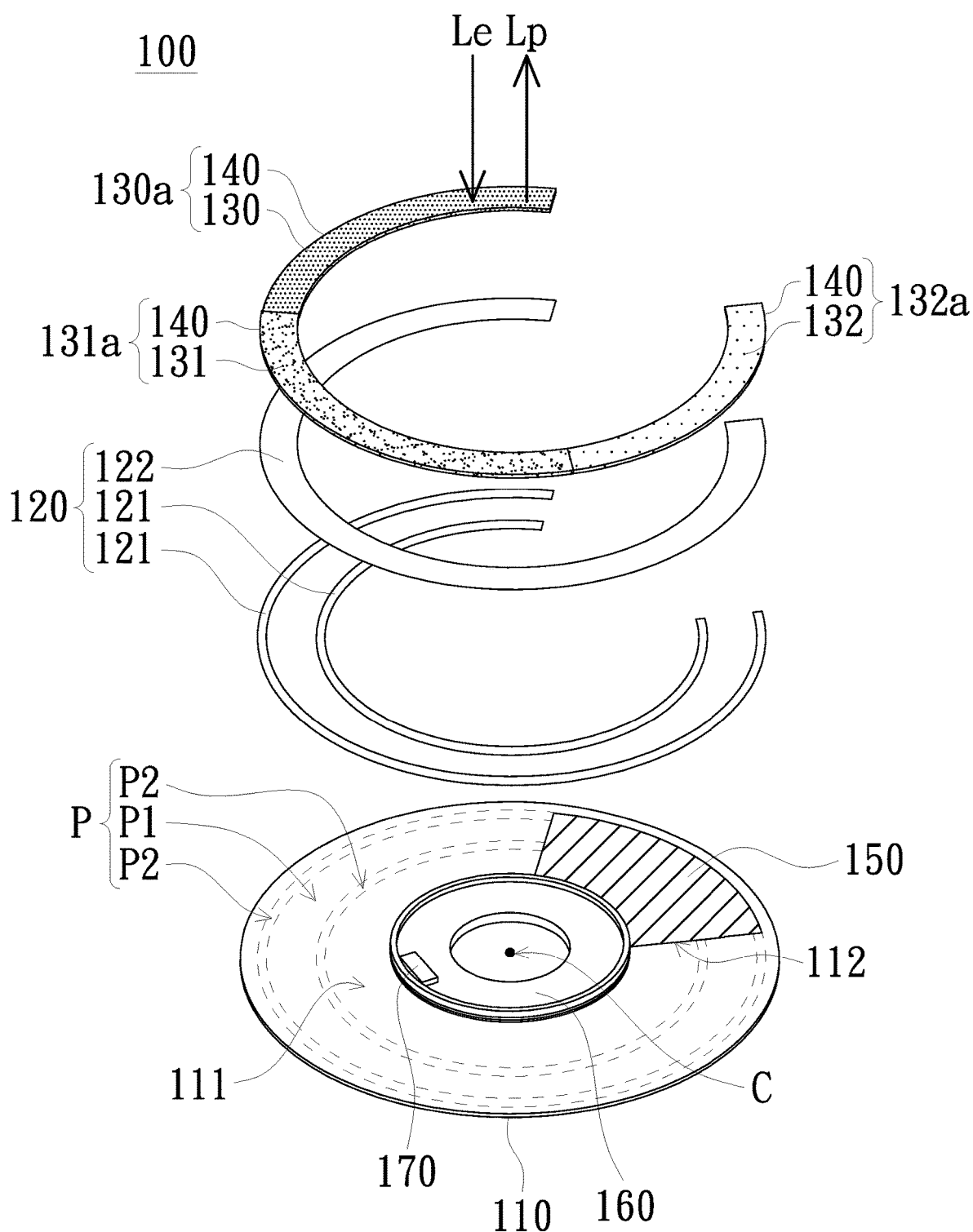
FIG. 2 is a schematic exploded diagram of the wavelength conversion element shown in FIG. 1.

FIG. 1 is a schematic diagram of a wavelength conversion element in an embodiment of the invention. FIG. 2 is a schematic exploded diagram of the wavelength conversion element shown in FIG. 1. Please refer to FIGS. 1 and 2, the wavelength conversion element 100 includes a substrate 110, an adhesion layer 120 and wavelength conversion materials 130, 131 and 132. The substrate 110 has a bearing surface 111. The bearing surface 111 has an adhesion zone P, wherein the adhesion zone P has a central portion P1 and two edge portions P2 respectively located on two sides of the central portion P1. The adhesion layer 120 is disposed on the adhesion zone P, wherein the adhesion layer 120 includes a first adhesive 121 and a second adhesive 122. The first adhesive 121 is disposed at the edge portions P2. The second adhesive 122 is disposed at the central portion P1. The operating temperature of the first adhesive 121 is lower than the operating temperature of the second adhesive 122, and the viscosity of the first adhesive 121 is larger than the viscosity of the second adhesive 122. The wavelength conversion materials 130, 131 and 132 are fixed on the bearing surface 111 by the first adhesive 121 and the second adhesive 122. The wavelength conversion materials 130, 131 and 132 are adapted to convert the excitation beam Le into the converted beam Lp.

The material of the substrate 110 may be metal, such as aluminum, copper or silver, or other materials with high temperature resistance and high thermal conductivity. Since the wavelength conversion element 100 in this embodiment takes a wavelength conversion wheel as an example, the substrate 110 is, for example, in a ring shape and has a center C. The adhesion zone P is around the center C. The edge portions P2 are respectively located at an inner side of the central portion P1 (closer to the center C) and an outer side of the central portion P1. The bearing surface 111 of the substrate 110 may be provided with a reflection layer to improve the efficiency of reflecting the excitation beam Le and the converted beam Lp, thereby improving the utilization of the beams.

Figure 3:
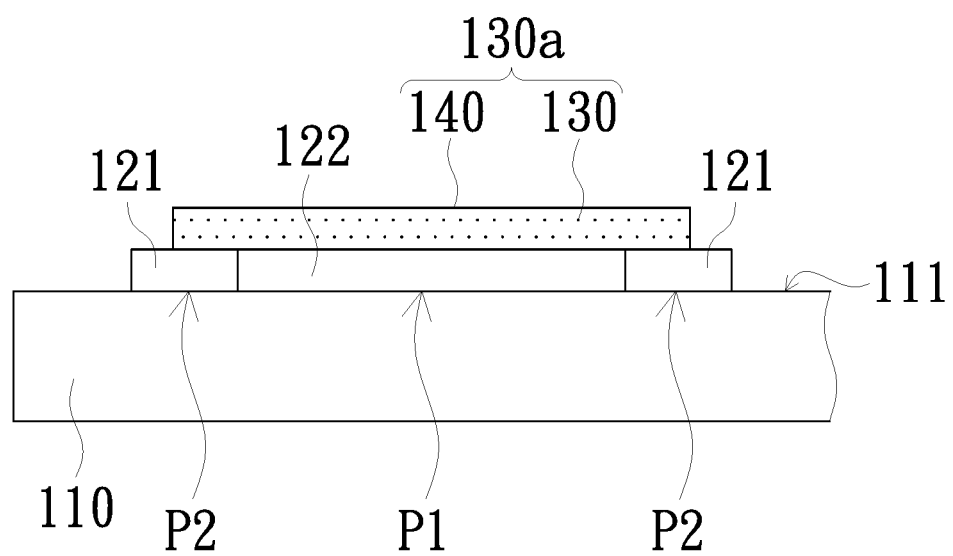
FIG. 3 is a schematic cross-sectional diagram of the wavelength conversion element, taken along the line A-A shown in FIG. 1.

FIG. 3 is a schematic cross-sectional diagram of the wavelength conversion element, taken along the line A-A in FIG. 1. Please refer to FIGS. 1 and 3, the wavelength conversion element 100 in this embodiment further includes, for example, a plurality of glue layers 140, wherein the quantity of the glue layers 140 corresponds to the quantity of the wavelength conversion materials 130, 131 and 132. The wavelength conversion materials 130, 131 and 132 are respectively disposed in the glue layers 140 so as to form the wavelength conversion sections 130a, 131a and 132a. The glue layers 140 are fixed on the first adhesive 121 and the second adhesive 122, so that the wavelength conversion materials 130, 131 and 132 are fixed on the bearing surface 111. The glue layer 140 has the characteristic of, for example, light transmission so as to allow the excitation beam Le to pass therethrough. The excitation beams Le transmitted into the glue layers 140 are respectively received by the wavelength conversion materials 130, 131 and 132. The wavelength conversion materials 130, 131 and 132 may include, for example, fluorescent materials with different emission wavelengths, phosphorescent materials such as phosphors, or nanomaterials such as quantum dots. For example, the wavelength conversion materials 130, 131 and 132 shown in FIG. 1 may respectively include green phosphor, yellow phosphor and red phosphor, and the wavelength conversion sections 130a, 131a and 132a respectively convert the excitation beams Le into, for example, the converted beams Lp with green color, yellow color and red color, but the invention is not limited thereto. Although FIGS. 1 and 2 take three wavelength conversion materials 130, 131 and 132 as an example, the quantity of the wavelength conversion materials can also be one, two or more than three.

Figure 4A:
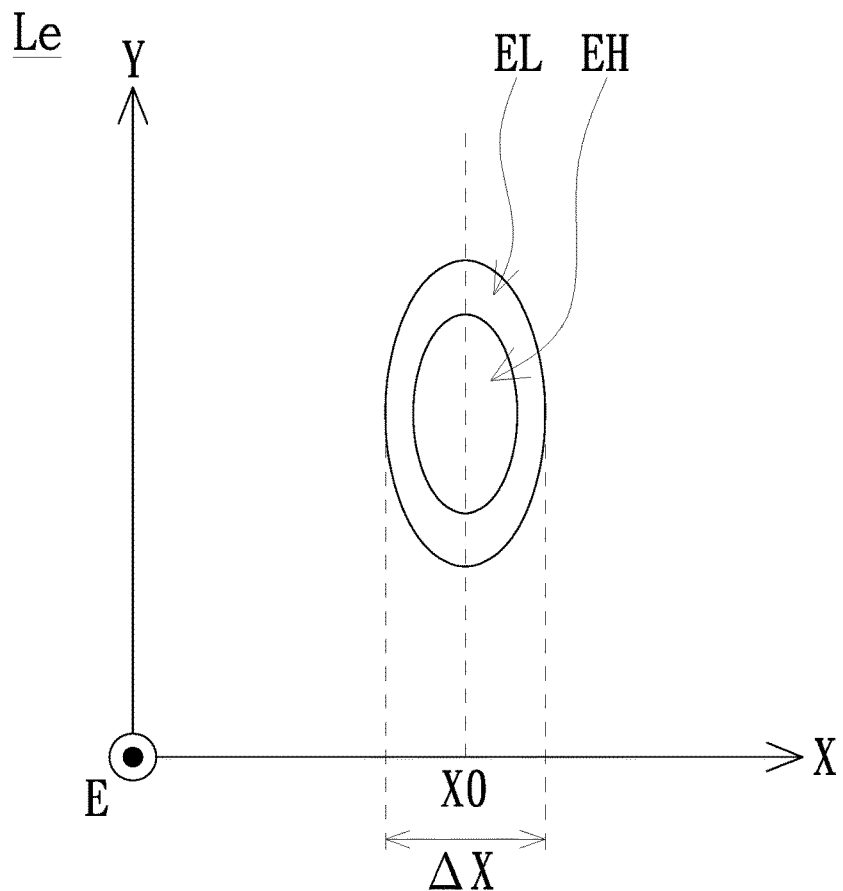
FIG. 4A is a schematic diagram of two-dimensional energy density distribution of the excitation beam irradiating on the wavelength conversion section shown in FIG. 2.
Figure 4B:
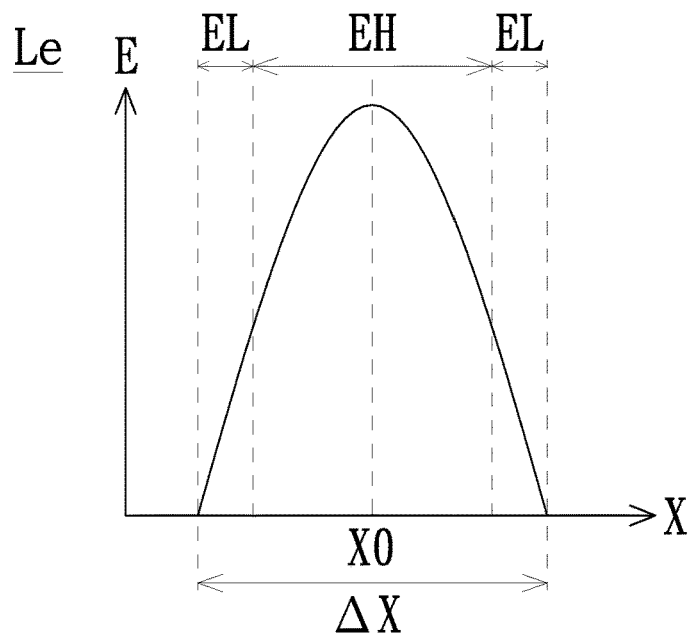
FIG. 4B is a schematic diagram of one-dimensional energy density distribution of the excitation beam irradiating on the wavelength conversion section shown in FIG. 2.

In this embodiment, the first adhesive 121 may include organic glue and the second adhesive 122 may include inorganic glue. The operating temperature of the inorganic glue is about 300° C.-400° C., and the viscosity of the inorganic glue is less than or equal to 200 mPa-sec. The operating temperature of the organic glue is less than or equal to 200° C., and the viscosity of the organic glue is less than or equal to 5600 mPa-sec. For example, the organic glue may include silicone and epoxy, and the inorganic glue may include glass glue. The first adhesive 121 is disposed at the edge portions P2, and the second adhesive 122 is disposed at the central portion P1, wherein the respective areas of the edge portions P2 and the central portion P1 (i.e. the areas for disposing the first adhesive 121 and the second adhesive 122) are designed according to the energy density of the excitation beam Le. For example, the energy density distribution of the excitation beam Le is shown in FIGS. 4A and 4B. Specifically, FIG. 4A is a schematic diagram of two-dimensional energy density distribution of the excitation beam irradiating on the wavelength conversion section 130a shown in FIG. 2. FIG. 4B is a schematic diagram of one-dimensional energy density distribution of the excitation beam Le irradiating on the wavelength conversion section 130a shown in FIG. 2. Please refer to FIG. 4A, the energy density distribution of the excitation beam Le can be divided into a high energy density zone EH and a low energy density zone EL. A distance ΔX between two sides of the low energy density zone EL can be regarded as a width of light spot of the excitation beam Le, and the middle point of the width of light spot ΔX is denoted as XO. The relationship between the energy density of the excitation beam Le and width of light spot ΔX is shown in FIG. 4B. Please refer to FIG. 4B, the energy density of the excitation beam Le in the high energy density zone EH is larger than the energy density of the excitation beam Le in the low energy density zone EL.

Please refer to FIGS. 3 and 4B. In this embodiment, the central portion P1 and the second adhesive 122 are designed to correspond to the high energy density zone EH, and the edge portions P2 and the first adhesive 121 are designed to correspond to the low energy density zone EL. Since the second adhesive 122 disposed at the central portion P1 corresponds to the high energy density zone EH, the energy received by the second adhesive 122 is higher, and therefore the temperature of the second adhesive 122 rises higher. On the contrary, since the first adhesive 121 disposed at the edge portions P2 corresponds to the low energy density zone EL, the energy received by the first adhesive 121 received is lower, and therefore the temperature of the first adhesive 121 does not rise too high. Therefore, in this embodiment, the second adhesive 122 having higher operating temperature is disposed at the central portion P1, and the first adhesive 121 having lower operating temperature is disposed at the edge portions P2. As a result, the problem of burning of the first adhesive 121 and the second adhesive 122 due to excessively high temperature can be avoided. In an embodiment, the operating temperature of the first adhesive 121 is, for example, below 200° C., and the operating temperature of the second adhesive 122 is, for example, about 300° C.-400° C., but the invention is not limited thereto. On the other hand, please refer to FIGS. 2 and 3, since the viscosity of the first adhesive 121 is larger than the viscosity of the second adhesive 122, the overall viscosity of the adhesion layer 120 can be enhanced by the first adhesive 121 disposed at the edge portions P2, so that the wavelength conversion sections 130a, 131a and 132a can be adhered on the substrate 110 more firmly. For these reasons, the wavelength conversion element 100 in this embodiment has improved durability.

In the prior art, the organic silica gel is used as the adhesion layer. However, since the thermal conductivity of the organic silica gel is relatively low (about 0.2 W/mK), the thermal energy accumulated at the phosphor layer cannot be quickly conducted to the substrate. As a result, in the prior art, the phosphor layer often has a low wavelength conversion efficiency due to high temperature. Please refer to FIGS. 2 and 4B, in order to solve the aforementioned problems, in an embodiment of the invention, the second adhesive 122 may be a material having higher thermal conductivity (such as inorganic glue, in which the thermal conductivity is larger than 0.2 W/mK and less than 1 W/mK), and the first adhesive 121 may be a material having lower thermal conductivity (such as organic glue, in which the thermal conductivity is about 0.2 W/mK). As a result, the thermal energy of the part of the wavelength conversion sections 130a, 131a and 132a irradiated by the high energy density zone EH can be quickly conducted to the substrate 110 via the second adhesive 122, so that the wavelength conversion efficiency of the part the wavelength conversion sections 130a, 131a and 132a irradiated by the high energy density zone EH is prevented from being worse due to the high temperature. On the other hand, the thermal conductivity of the first adhesive 121 is less than the thermal conductivity of the second adhesive 122; however, since the first adhesive 121 corresponds to the part of the wavelength conversion sections 130a, 131a and 132a irradiated by the low energy density zone EL, the problem in which the wavelength conversion efficiency of the part of the wavelength conversion sections 130a, 131a and 132a irradiated by the low energy density zone EL due to high temperature is prevented from being worse, even though the thermal conductivity of the first adhesive 121 is relatively lower. For these reasons, compared with the prior art, the wavelength conversion element 100 in this embodiment has improved wavelength conversion efficiency.

Please refer to FIGS. 1 and 2, the substrate 110 in this embodiment may further have an optical zone 112. The optical zone 112 is, for example, an opening of the substrate 110 and may be located between two adjacent wavelength conversion materials, for example, located between the wavelength conversion materials 130 and 132. In another embodiment, the wavelength conversion element 100 may further include a plate body 150 disposed at the optical zone 112 of the substrate 110. The shape of the plate body 150 may be corresponding to the optical zone 112. For example, the plate body 150 may be embedded in the optical zone 112. The plate body 150 may be a light-transmitting plate, such as a glass substrate, to allow the excitation beam Le to pass therethrough. The light-transmitting plate may be provided with a light diffusion layer or a light diffusion microstructure to eliminate the laser speckle formed by the excitation beam Le. In an embodiment, the plate body 150 is, for example, an anti-reflection glass (AR glass). It is worth mentioning that because the optical zone 112 itself is an opening structure, the optical zone 112 can be used as a light-transmitting zone and allow the excitation beam Le to directly pass therethrough without disposing the plate body 150 or other optical elements. Additionally, according to different design requirements, the optical zone 112 may also be a reflection zone for reflecting the excitation beam Le. In this case, the plate body 150 may be a reflection plate, and the optical zone 112 does not need to be set as an opening. Alternatively, a reflection layer may be directly formed on the substrate 110 to reflect the excitation beam Le without disposing the plate body 150 and the opening on the substrate 110.

In the embodiment in which the wavelength conversion element 100 is a wavelength conversion wheel, the wavelength conversion element 100 may further include a motor (not shown), a fixing ring 160 and a counterweight member 170. The substrate 110 and the fixing ring 160 are sleeved on a shaft (not shown) of the motor, the substrate 110 is fixed on the motor by the fixing ring 160, and the motor is adapted to drive the substrate 110 to rotate. The counterweight member 170 is disposed, for example, on the fixing ring 160 so as to adjust the overall rotating balance of the wavelength conversion element 100. Specifically, the counterweight member 170 can improve the initial amount of unbalance of the wavelength conversion element 100, so that the wavelength conversion element 100 can be rotated stably at high speed.

Figure 5:
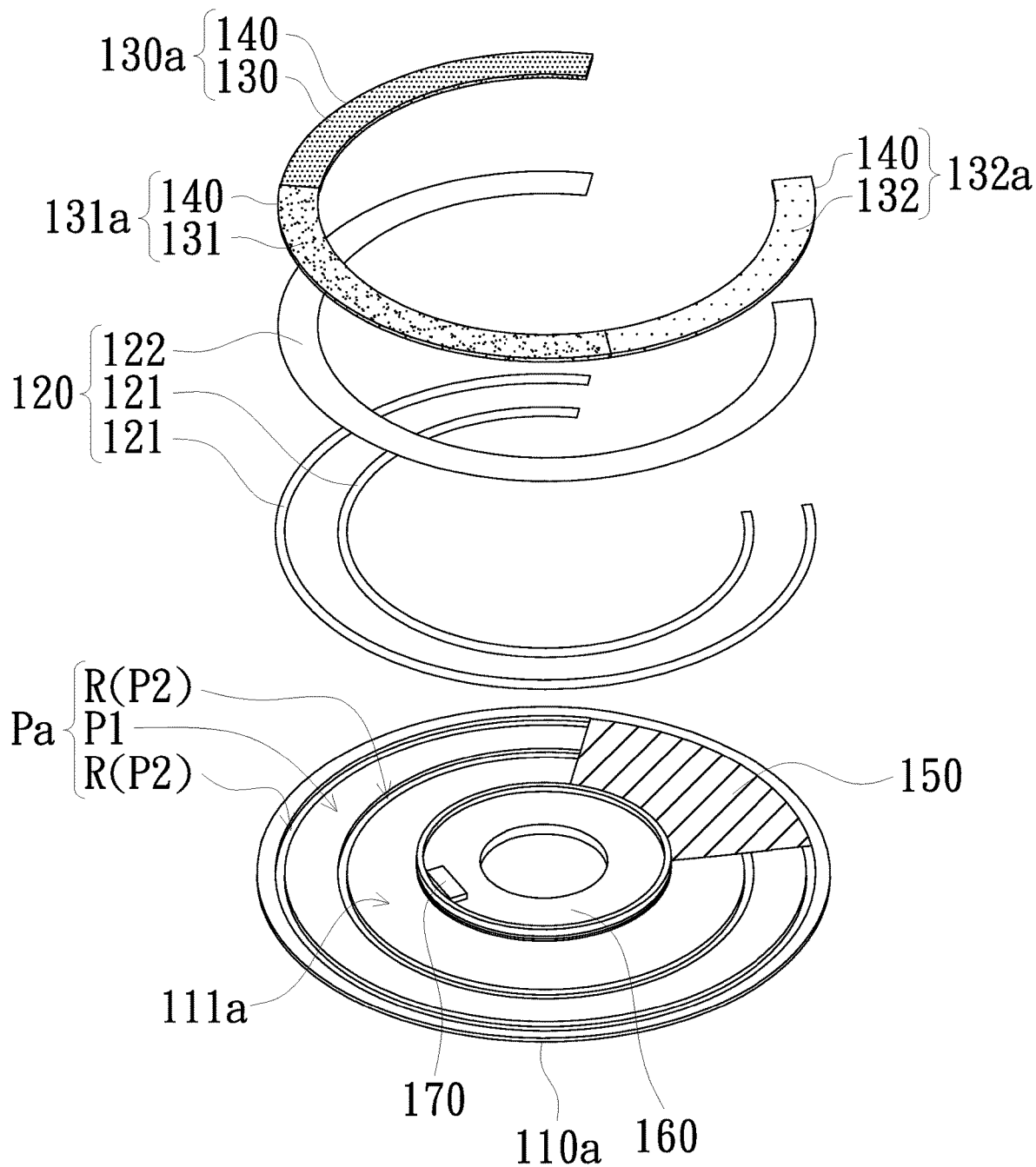
FIG. 5 is a schematic exploded diagram of a wavelength conversion element in another embodiment of the invention.
Figure 6:
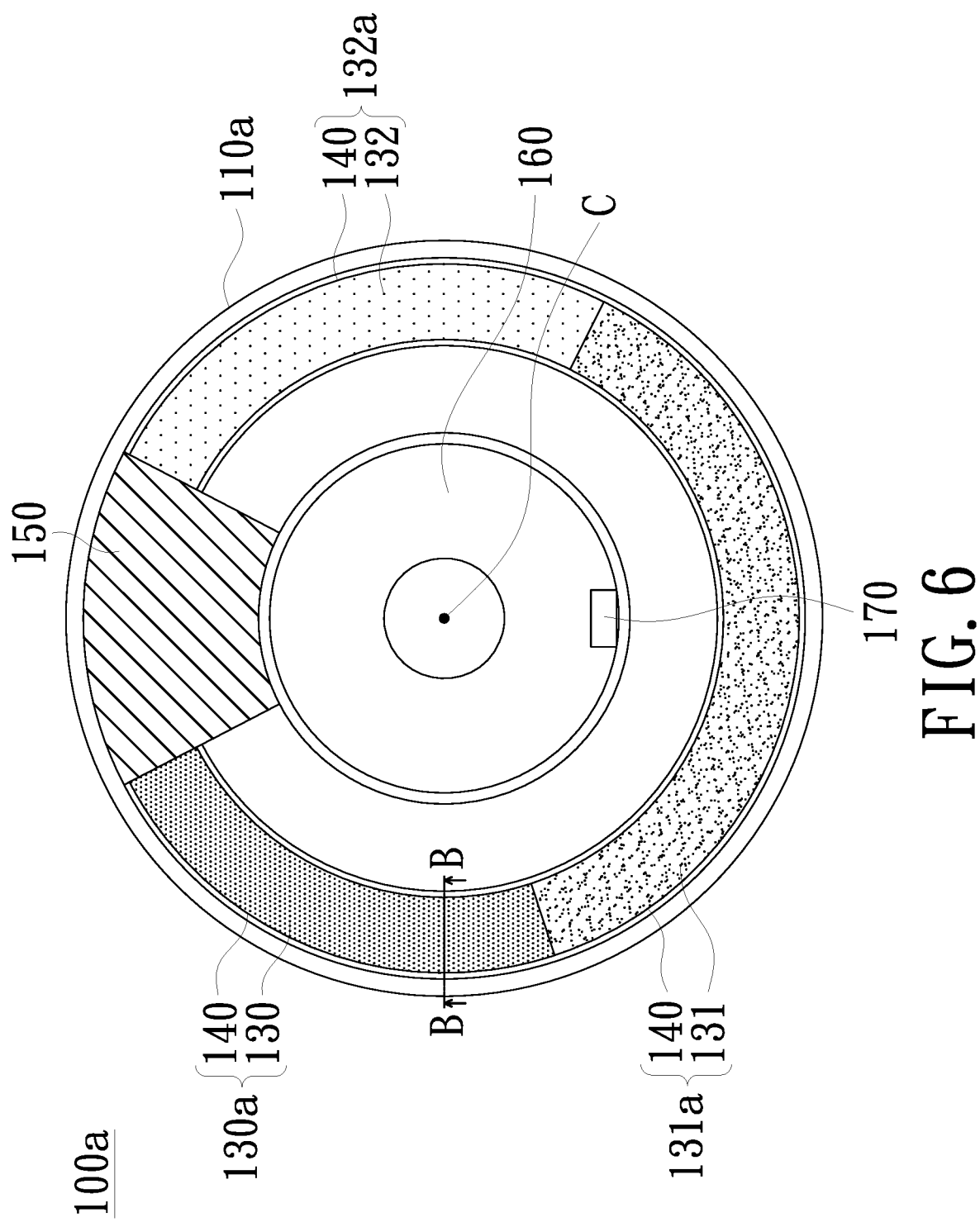
FIG. 6 is a schematic assemble diagram of the wavelength conversion element shown in FIG. 5.

FIG. 5 is a schematic exploded diagram of a wavelength conversion element in another embodiment of the invention. FIG. 6 is a schematic assemble diagram of the wavelength conversion element shown in FIG. 5. The structure and the advantage of the wavelength conversion element 100a in this embodiment are similar to those of the aforementioned wavelength conversion element 100, and the main difference is the edge portions P2 of the adhesion zone Pa. Please refer to FIGS. 5 and 6, the edge portions P2 are respectively provided with a groove R. The first adhesive 121 is disposed in the grooves R of the edge portions P2. Particularly, the first adhesive 121 may protrude from the grooves R (shown in FIG. 7). In this embodiment, the grooves R can effectively adjust the thicknesses of the first adhesive 121 and the second adhesive 122 and meanwhile keep the surface of the adhesion layer 120 disposed with the wavelength conversion materials 130, 131 and 132 flat. Please refer to the description hereinafter for more details.

Figure 7:
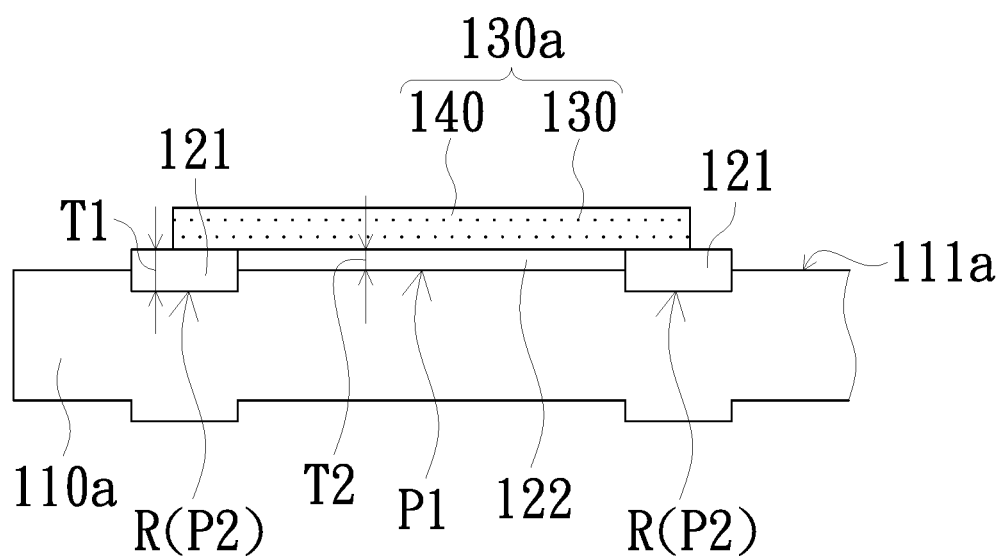
FIG. 7 is a schematic cross-sectional diagram of the wavelength conversion element, taken along the line B-B in FIG. 6.

FIG. 7 is a schematic cross-sectional diagram of the wavelength conversion element, taken along the line B-B in FIG. 6. Please refer to FIGS. 6 and 7, the thickness T1 of the first adhesive 121 is greater than the thickness T2 of the second adhesive 122 due to that the edge portions P2 are respectively provided with a groove R. As the description mentioned in the background of the invention, since the second adhesive 122 corresponds to the high energy density zone EH shown in FIG. 4B, the second adhesive 122 having a relatively small thickness T2 can conduct the thermal energy from the wavelength conversion sections 130a, 131a and 132a to the substrate 110a more quickly. Additionally, the adhesion of the first adhesive 121 can be enhanced by increasing the thickness T1 thereof, thereby further improving the durability of the wavelength conversion element 100a. In an embodiment, the thickness T1 of the first adhesive 121 is, for example, between 0.05 mm and 0.2 mm, and the thickness T2 of the second adhesive 122 can be adjusted based on the thermal conductivity of the material of the second adhesive 122, but the invention is not limited thereto.

It is worth mentioning that in addition to the above effects, the groove R can further limit the positions of the first adhesive 121 and the second adhesive 122, so the positions of the first adhesive 121 and the second adhesive 122 are not shifted when the wavelength conversion element 100a is rotated at high speed. In addition, the groove R can limit the shapes of the first adhesive 121 and the second adhesive 122 before curing, so the first adhesive 121 and the second adhesive 122 are prevented from having glue overflow during the process of adhering the wavelength conversion sections 130a, 131a and 132a, thereby controlling the thicknesses T1 and the T2 within a suitable range. Bases on the above descriptions, even though the first adhesive 121 and the second adhesive 122 have different thermal conductivities, the thermal-conducting efficiency of the first adhesive 121 and the thermal-conducting efficiency of the second adhesive 122 are able to be similar to each other due to that the thickness T1 of the first adhesive 121 and the thickness T2 of the second adhesive 122 can be respectively controlled within a suitable range by the grooves R, and therefore the adhesion layer 120 can provide uniform thermal conductivity.

Figure 8:
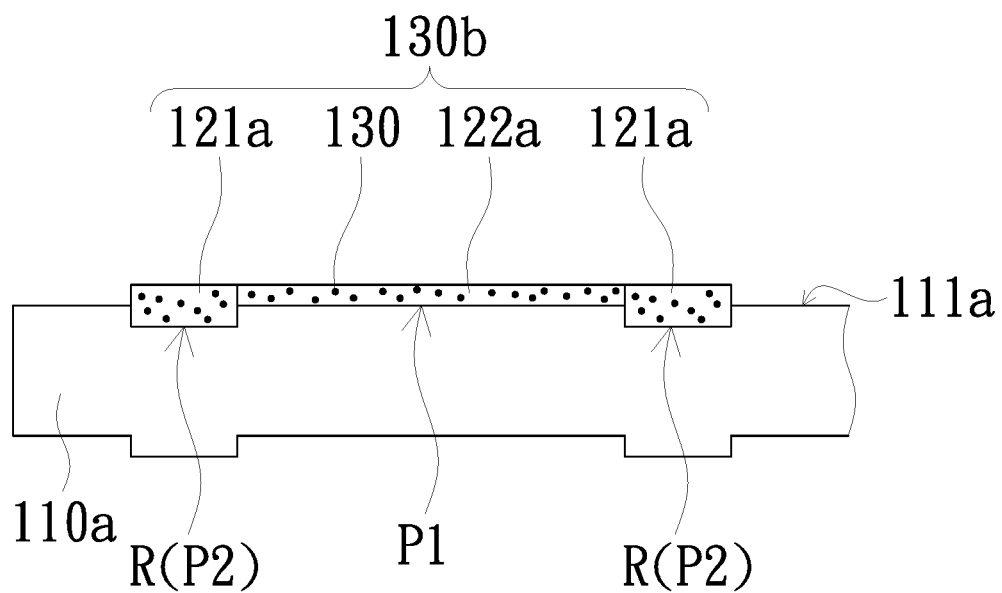
FIG. 8 is a schematic cross-sectional diagram of a wavelength conversion element in another embodiment of the invention.

Although the wavelength conversion materials 130, 131 and 132 are disposed on the adhesion layer 120 in each above embodiment, the invention is not limited thereto. The wavelength conversion materials 130, 131 and 132 may also be disposed in the adhesion layer 120. FIG. 8 is a schematic cross-sectional diagram of a wavelength conversion element in another embodiment of the invention. The structure and the advantage of the wavelength conversion element 100b in this embodiment are similar to the aforementioned wavelength conversion element 100, and the following only describes the difference. Please refer to FIG. 8, in this embodiment, the wavelength conversion element 100b does not include aforementioned glue layer 140, and the wavelength conversion material 130 is respectively disposed in the first adhesive 121a and the second adhesive 122a. The wavelength conversion material 130 may be, for example, mixed in the uncured first adhesive 121a and the uncured second adhesive 122a respectively, and then the uncured first adhesive 121a and the uncured second adhesive 122a are respectively disposed at the edge portions P2 and the central portion P1 through a coating step, and then the wavelength conversion sections 130b are formed through a curing step. It should be noticed that the substrate 110a shown in FIG. 8 can be replaced by the substrate 110 without the grooves R shown in FIGS. 1 and 2, and the structure of the substrate is not limited in this embodiment. Additionally, although the embodiment shown in FIG. 8 is taken one wavelength conversion material 130 as an example, the wavelength conversion element 100b may also include other wavelength conversion materials.

Figure 9:
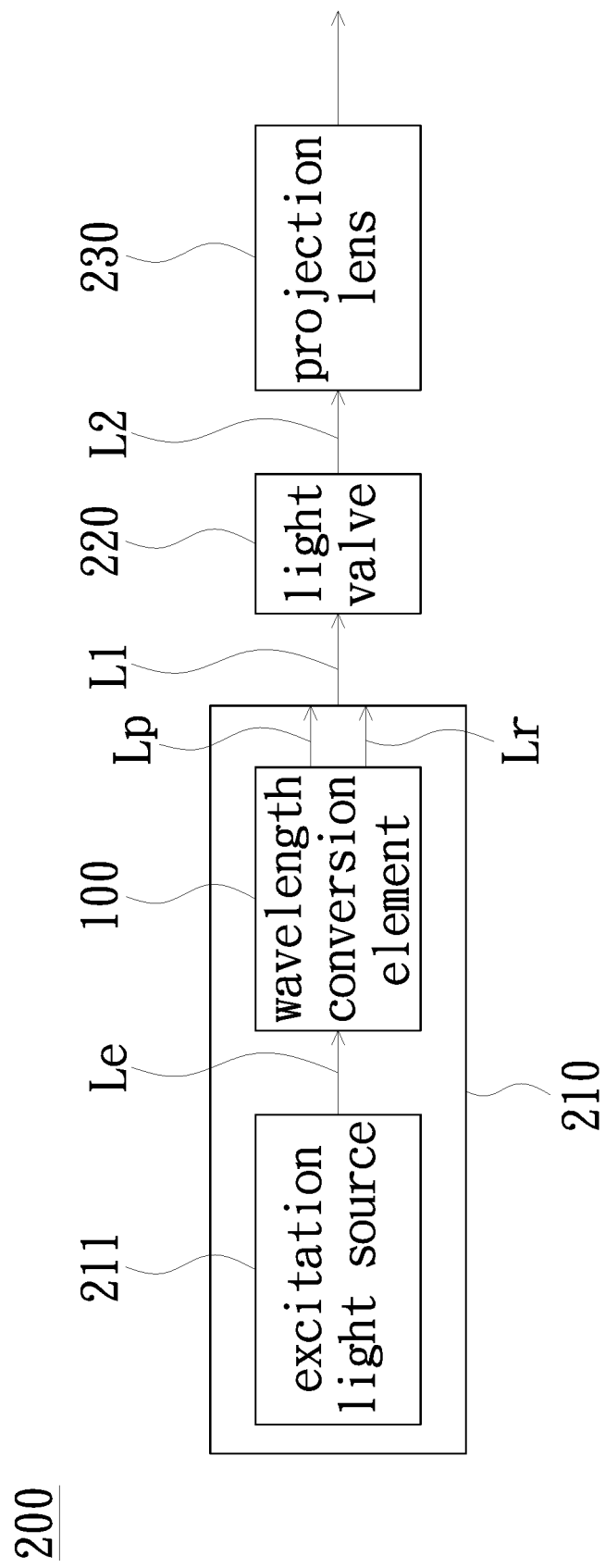
FIG. 9 is a schematic block diagram of a projection apparatus in an embodiment of the invention.

FIG. 9 is a schematic block diagram of a projection apparatus in an embodiment of the invention. Please refer to FIG. 9, the projection apparatus 200 includes an illumination system 210, a light valve 220 and a projection lens 230. The illumination system 210 is adapted to provide an illumination beam L1. The light valve 220 is disposed on a transmission path of the illumination beam L1 so as to convert the illumination beam L1 into an image beam L2. The projection lens 230 is disposed on a transmission path of the image beam L2.

The illumination system 210 includes an excitation light source 211 and any one of the wavelength conversion elements 100, 100a and 100b in the above embodiments, wherein the illumination system 210 in FIG. 9 uses the wavelength conversion element 100 in FIG. 9 as an example, but the invention is not limited thereto. The excitation light source 211 is adapted to provide an excitation beam Le. Specifically, the excitation light source 211 includes, for example, a light emitting diode (LED) or a laser diode (LD), wherein the quantity of the light emitting diodes or the laser diodes may be one or plural. For instance, when the quantity of the light emitting diodes (or the laser diodes) is plural, the light emitting diodes (or the laser diodes) can be arranged in a matrix, but the invention is not limited thereto. The wavelength conversion element 100 is disposed on a transmission path of the excitation beam Le, and the wavelength conversion materials 130, 131 and 132 of the wavelength conversion element 100 are irradiate by the excitation beam Le. In a time sequence the excitation beam Le is converted into a converted beam Lp by the wavelength conversion materials 130, 131 and 132 of wavelength conversion element 100; and in another time sequence, the excitation beam Le passes through the optical zone 112 (shown in FIGS. 1 and 2) of the wavelength conversion element 100 or is reflected by the substrate 110 of the wavelength conversion element 100 (in FIG. 12, the excitation beam Le after passing through the wavelength conversion element 100 is illustrated by the beam Lr). Thus, an illumination beam L1 is formed sequentially by the beam Lr and the converted beam Lp. Since the features of the wavelength conversion element 100 have been described above, no redundant detail is to be given herein.

The light valve 220 is, for example, a digital micro mirror device (DMD), a liquid crystal on silicon (LCoS) or a liquid crystal display (LCD), but the invention is not limited thereto. Also, the quantity of the light valves is not limited in the invention. For example, the projection apparatus 200 in this embodiment may adopt a structure with single-panel LCD or three-panel LCD, but the invention is still not limited thereto.

The projection lens 230 includes, for example, a combination of one or more optical lenses having diopter, such as any combination of a biconcave lens, a biconvex lens, a meniscus lens, a convex-concave lens, a plano-convex lens and a plano-concave lens. On the other hand, the projection lens 230 may also include a flat optical lens. The kind or the type of the projection lens 230 is not limited in the invention.

Since the wavelength conversion element 100 has improved durability and light conversion efficiency, the projection apparatus 200 adopting the wavelength conversion element 100 accordingly has improved durability and image quality.

In summary, in the wavelength conversion element of the embodiments of the invention, since the adhesion zone where the adhesion layer is disposed on is divided into the central portion and the edge portion and the central portion receives more heat, the central portion is provided with the second adhesive having higher operating temperature to prevent the second adhesive from burning due to high temperature. On the other hand, since the edge portions receive less heat, the edge portions are provided with the first adhesive having larger viscosity to enhance the adhesion effect of the adhesion layer. As a result, the adhesion layer of the wavelength conversion element of the invention has the advantages of improved operating temperature and viscosity, so that the durability of the wavelength conversion element is improved. Also, since adopting the aforementioned wavelength conversion element, the projection apparatus of the invention has the advantage of improved durability. Additionally, in an embodiment, since the thermal conductivity of the second adhesive is higher, the problem in which the wavelength conversion efficiency being worse caused by the high temperature can be prevented. Thus, the wavelength conversion efficiency of the wavelength conversion element is improved, and the quality of the image of the projection apparatus using the wavelength conversion element is also improved.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "The invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims. Furthermore, the terms such as the first adhesive and the second adhesive are only used for distinguishing various elements and do not limit the number of the elements.

What is claimed is:

1. A wavelength conversion element, comprising a substrate, an adhesion layer and a wavelength conversion material, wherein:

the substrate has a bearing surface, wherein the bearing surface has an adhesion zone, the adhesion zone has a central portion and two edge portions respectively located on two sides of the central portion;

the adhesion layer is disposed on the adhesion zone, wherein the adhesion layer comprises a first adhesive and a second adhesive, the first adhesive is disposed at the two edge portions, the second adhesive is disposed at the central portion, an operating temperature of the first adhesive is lower than an operating temperature of the second adhesive, and a viscosity of the first adhesive is larger than a viscosity of the second adhesive; and the wavelength conversion material is fixed on the bearing surface by the first adhesive and the second adhesive;

wherein the two edge portions are respectively provided with a groove, and the first adhesive is disposed in the grooves of the two edge portions.

2. The wavelength conversion element according to claim 1, wherein the wavelength conversion material is disposed in the first adhesive and the second adhesive.

3. The wavelength conversion element according to claim 1, wherein the first adhesive comprises organic glue, and the second adhesive comprises inorganic glue.

4. The wavelength conversion element according to claim 3, wherein a thickness of the first adhesive is between 0.05 mm and 0.2 mm.

5. The wavelength conversion element according to claim 1, wherein a thickness of the first adhesive is greater than a thickness of the second adhesive.

6. The wavelength conversion element according to claim 1, wherein a thermal conductivity of the first adhesive is less than a thermal conductivity of the second adhesive.

7. The wavelength conversion element according to claim 1, wherein the first adhesive protrudes from the grooves.

8. The wavelength conversion element according to claim 1, wherein the substrate is in a ring shape and has a center, the adhesion zone is around the center, and the two edge portions are respectively located at an outer side and an inner side of the central portion.

9. A wavelength conversion element, comprising a substrate, an adhesion layer and a wavelength conversion material, wherein:

the substrate has a bearing surface, wherein the bearing surface has an adhesion zone, the adhesion zone has a central portion and two edge portions respectively located on two sides of the central portion;

the adhesion layer is disposed on the adhesion zone, wherein the adhesion layer comprises a first adhesive and a second adhesive, the first adhesive is disposed at the two edge portions, the second adhesive is disposed at the central portion, an operating temperature of the first adhesive is lower than an operating temperature of the second adhesive, and a viscosity of the first adhesive is larger than a viscosity of the second adhesive; and the wavelength conversion material is fixed on the bearing surface by the first adhesive and the second adhesive;

a glue layer is fixed on the first adhesive and the second adhesive, wherein the wavelength conversion material is disposed in the glue layer.

10. A projection apparatus, comprising an illumination system, a light valve and a projection lens, the illumination system being adapted to provide an illumination beam, the light valve being disposed on a transmission path of the illumination beam to convert the illumination beam into an image beam, and the projection lens being disposed on a transmission path of the image beam, wherein the illumination system comprises an excitation light source and a wavelength conversion element, wherein:

the excitation light source is adapted to provide an excitation beam; and the wavelength conversion element is disposed on a transmission path of the excitation beam, and the wavelength conversion element comprises a substrate, an adhesion layer and a wavelength conversion material, wherein:

the substrate has a bearing surface, the bearing surface has an adhesion zone, and the adhesion zone has a central portion and two edge portions respectively located on two sides of the central portion;

the adhesion layer is disposed on the adhesion zone, the adhesion layer comprises a first adhesive and a second adhesive, the first adhesive is disposed at the two edge portions, the second adhesive is disposed at the central portion, an operating temperature of the first adhesive is lower than an operating temperature of the second adhesive, and a viscosity of the first adhesive is larger than a viscosity of the second adhesive; and the wavelength conversion material is fixed on the bearing surface by the first adhesive and the second adhesive;

wherein the two edge portions are receptively provided with a groove, and the first adhesive is disposed in the grooves of the two edge portions.

11. The projection apparatus according to claim 10, wherein an energy density of the excitation beam irradiated on the first adhesive is less than an energy density of the excitation beam irradiated on the second adhesive.

* * * * *